US006864520B2

(12) United States Patent
Fischetti et al.

(10) Patent No.: US 6,864,520 B2
(45) Date of Patent: Mar. 8, 2005

(54) GERMANIUM FIELD EFFECT TRANSISTOR AND METHOD OF FABRICATING THE SAME

(75) Inventors: Massimo V. Fischetti, Putnam Valley, NY (US); Steven E. Laux, Yorktown Heights, NY (US); Paul M. Solomon, Yorktown Heights, NY (US); Hon-Sum Philip Wong, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/116,568

(22) Filed: Apr. 4, 2002

(65) Prior Publication Data

US 2003/0190791 A1 Oct. 9, 2003

(51) Int. Cl.[7] .............................................. H01L 27/148
(52) U.S. Cl. .......................... 257/255; 257/51; 257/64; 257/65; 257/66; 257/67; 257/70
(58) Field of Search .............................. 257/51, 64, 65, 257/66, 67, 70, 255, 14, 199

(56) References Cited

U.S. PATENT DOCUMENTS

| | | | | |
|---|---|---|---|---|
| 3,603,848 A | * | 9/1971 | Sato et al. ................. | 257/255 |
| 4,119,996 A | | 10/1978 | Jhabvala | |
| 4,225,879 A | | 9/1980 | Vinson | |
| 4,233,617 A | | 11/1980 | Klaassen et al. | |
| 4,768,076 A | * | 8/1988 | Aoki et al. ................. | 257/70 |
| 4,857,986 A | * | 8/1989 | Kinugawa ................. | 257/255 |
| 5,317,175 A | * | 5/1994 | Throngnumchai ......... | 257/255 |
| 5,932,893 A | * | 8/1999 | Miyanaga et al. ........... | 257/66 |
| 6,165,874 A | * | 12/2000 | Powell et al. .............. | 438/478 |
| 6,373,075 B1 | * | 4/2002 | Yamazaki et al. ........... | 257/72 |
| 6,436,748 B1 | * | 8/2002 | Forbes et al. .............. | 438/199 |
| 2001/0026006 A1 | | 10/2001 | Noble et al. | |
| 2002/0100909 A1 | | 8/2002 | Yamaguchi et al. | |

OTHER PUBLICATIONS

PCT Written Opinion mailed May 11, 2004.
Saito, et al., "Supression of Short Channel Effect in Triangular Parallel Wire Channel MOSFETs" (IEEE Silicon Nanoelectronics Workshop, pp. 6–7, Kyoto, Japan, Jun. 10–11, 2001).
Huang, et al., in"Sub 50–nm FinFET: PMOS" (IEEE International Electron Devices Meeting (IEDM), pp 67–70, 1999).
Lang, et al., "Bulk micromachining of Ge for IR gratings",J. Micromech. Microeng., vol. 6, pp. 46–48, 1996).

* cited by examiner

Primary Examiner—Michael S. Lebentritt
Assistant Examiner—Douglas Menz
(74) Attorney, Agent, or Firm—Casimer K. Salys, Esq.; McGinn & Gibb, PLLC

(57) ABSTRACT

A method (and structure) for an electronic chip having at least one layer of material for which a carrier mobility of a first carrier type is higher in a first crystal surface than in a second crystal surface and for which a carrier mobility of a second carrier type is higher in the second crystal surface than the first crystal surface includes a first device having at least one component fabricated on the first crystal surface of the material, wherein an activity of the component of the first device involves primarily the first carrier type, and a second device having at least one component fabricated on the second crystal surface of the material, wherein an activity of the component of the second device involves primarily the second carrier type.

20 Claims, 7 Drawing Sheets

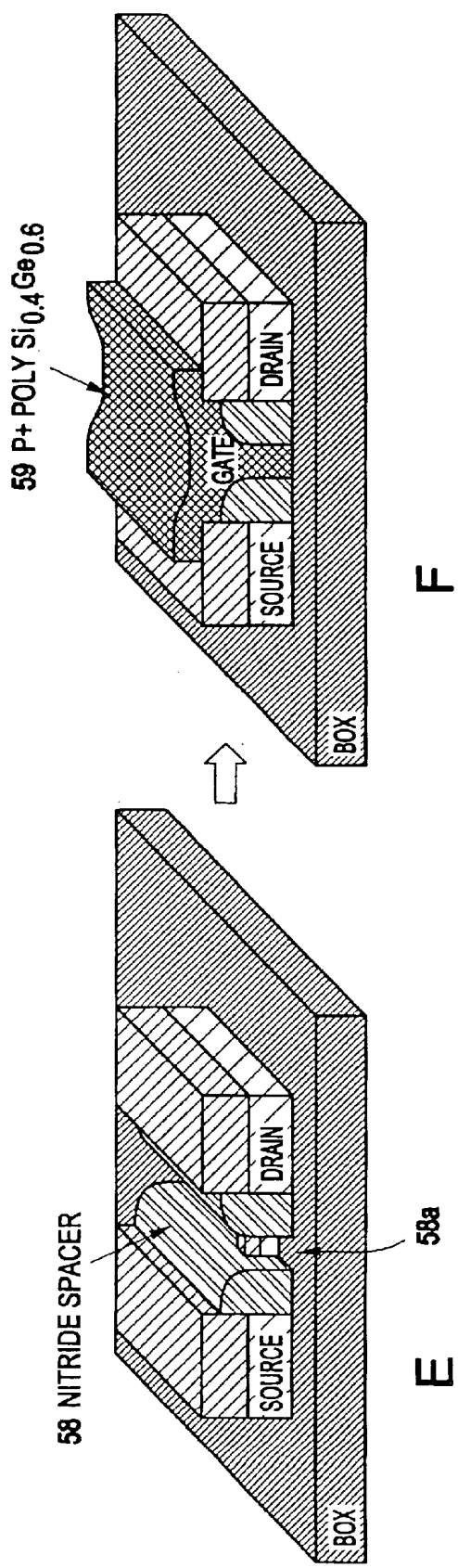
FIG.5(Con't.)
PRIOR ART

GERMANIUM FIELD EFFECT TRANSISTOR AND METHOD OF FABRICATING THE SAME

BACKGROUND OF THE INVENTION

1. Field of the Invention

The present invention generally relates to fabricating an n-channel FET and p-channel FET on the same wafer in a manner that optimizes carrier transport for each device. Specifically, on a Germanium layer an n-channel FET is fabricated on the (111) surface in the <110> direction and a p-channel FET is fabricated on the (100) surface in the <110> direction.

2. Description of the Related Art

Carrier transport in the germanium field effect transistor (Ge FET) is known to be enhanced relative to silicon field effect transistors. The prior art, therefore, recognizes that germanium provides a superior electron mobility compared to silicon. Additionally, the prior art commonly combines nFETs and pFETs on a single wafer for CMOS circuits. What is missing in the prior art, however, is an optimization of the structure and orientation of the complementary devices, as based on characteristics of carrier mobility.

SUMMARY OF THE INVENTION

The present inventors have noticed that not only is carrier mobility higher in germanium relative to silicon but have also noticed that, to maximize carrier transport benefits, it is necessary to choose the proper crystal orientation and direction along which the carrier transport occurs. This recognition becomes even more significant for CMOS where two carrier types are involved. Therefore, the present invention teaches that there is a preferred crystal orientation and direction for each device of a circuit, as based on the type of carrier of that device. An exemplary embodiment is an nFET having a channel fabricated on the (111) crystal surface of germanium. The present invention additionally provides a method of fabricating two devices on the same chip, where each device involves a different carrier type having a crystal surface for optimal carrier mobility. An exemplary embodiment provides both n-channel and p-channel FETs on germanium and using the respectively preferred crystal orientations.

FIG. 1 shows a calculated comparison of electron mobility in silicon and germanium inversion layers as a function of electron sheet density, with and without the inclusion of scattering with interface roughness. As shown by plot 1, the electron mobility for a germanium inversion layer on the (111) surface is significantly higher than the (100) surface of germanium (plot 2) or the (100) surface of silicon (plot 3). The open symbols in these three plots represent no surface roughness and the solid symbols represent corresponding plots 4, 5, 6 with surface roughness.

Specifically, in germanium the n-channel FET carrier transport is higher in the (111) crystal surface in the <110> direction and the p-channel FET current transport is higher in the (100) crystal surface in the <110> direction. The inventors have realized that by respecting this guideline the carrier transport can be optimal for n-channel FETs and p-channel FETs in germanium by choosing for each device a device structure based on the crystal direction and orienting the device in the <110> direction.

It is, therefore, an object of the present invention to provide a structure and method for fabricating an n-channel FET in germanium on the (111) surface in the <110> direction.

It is another object of the present invention to provide a structure and method for fabricating on the same wafer a first device having a first type of carrier in which carrier mobility is higher in the (111) crystal orientation and a second device having a second type of carrier in which carrier mobility is higher in the (100) crystal orientation.

It is another object of the present invention to provide a specific embodiment of this method and structure to form n-channel FETs and p-channel FETs together on the same chip, using Germanium as the underlying layer.

It is another object of the present invention to teach a method to obtain the best carrier transport properties of both nFETs and pFETs in a Ge MOSFET, or any MOSFET which has different transport properties on the (111) and (100) surfaces.

To achieve the above and other objectives, in a first aspect of the present invention, described herein is a method and structure for an electronic chip including a first device having a first carrier type, the first device fabricated on a (111) crystal surface of a material having a carrier mobility of the first carrier type higher in the (111) surface than in a (100) surface. A preferred embodiment of this first aspect is an n-channel FET fabricated in germanium on the (111) surface in the <110> direction.

In a second aspect of the present invention, described herein is a method and structure for an electronic chip including a first device having a first carrier type, the first device fabricated on a (111) crystal surface of a material having a carrier mobility of the first carrier type higher in the (111) surface than in a (100) surface, and a second device having a second carrier type, the second device fabricated in a (100) crystal surface of the material, the material having a carrier mobility of the second carrier type higher in the (100) surface than in the (111) surface. A preferred embodiment of this second aspect comprises an n-channel FET on the (111) surface in the <110> direction and a p-channel FET on the (100) surface in the <110> direction, where both devices are fabricated in a germanium layer.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
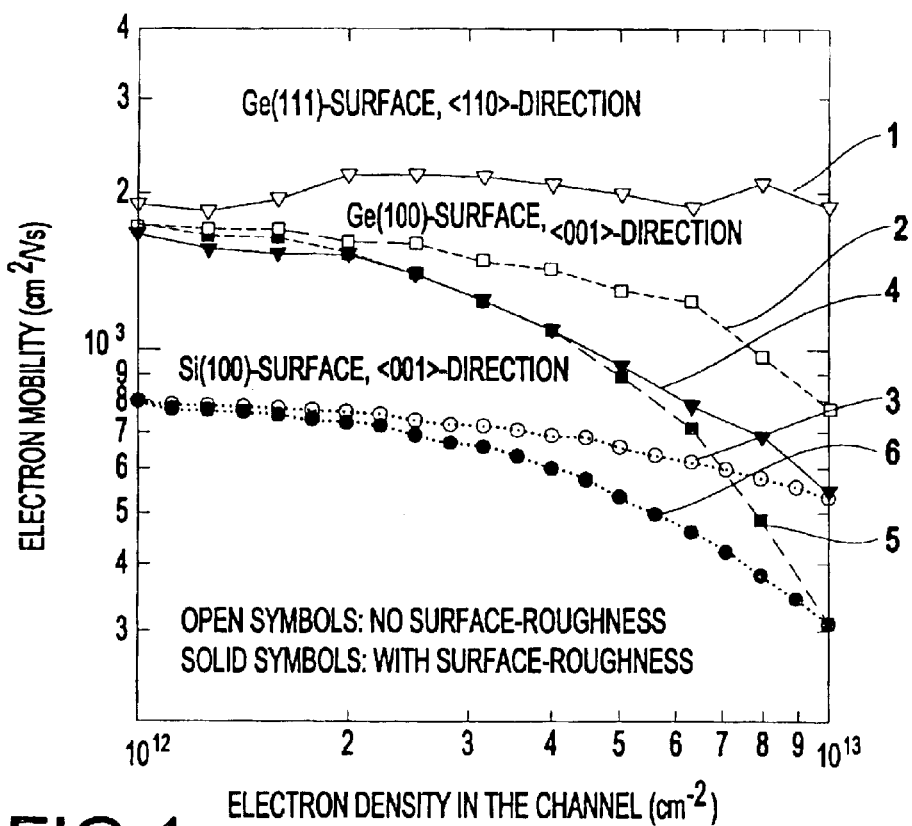
FIG. 1 shows a calculated comparison of electron mobility in silicon and germanium inversion layers as a function of electron sheet density.

Referring now to the drawings, and more particularly to FIG. 1, by comparing the plot 1 with plots 2, 3, and 6, the electron mobility for the Ge inversion layer on the (111) surface is significantly higher than that of either Si or Ge on the (100) surface. Through rigorous device modeling and analyses, the inventors have generated this figure and, thereby, determined that germanium field effect transistor (Ge FET) has high current drive when the n-channel FET current transport is in the (111) surface in the <110> direction, and p-channel FET current transport is in the (100) surface in the <110> direction.

Figure 2:
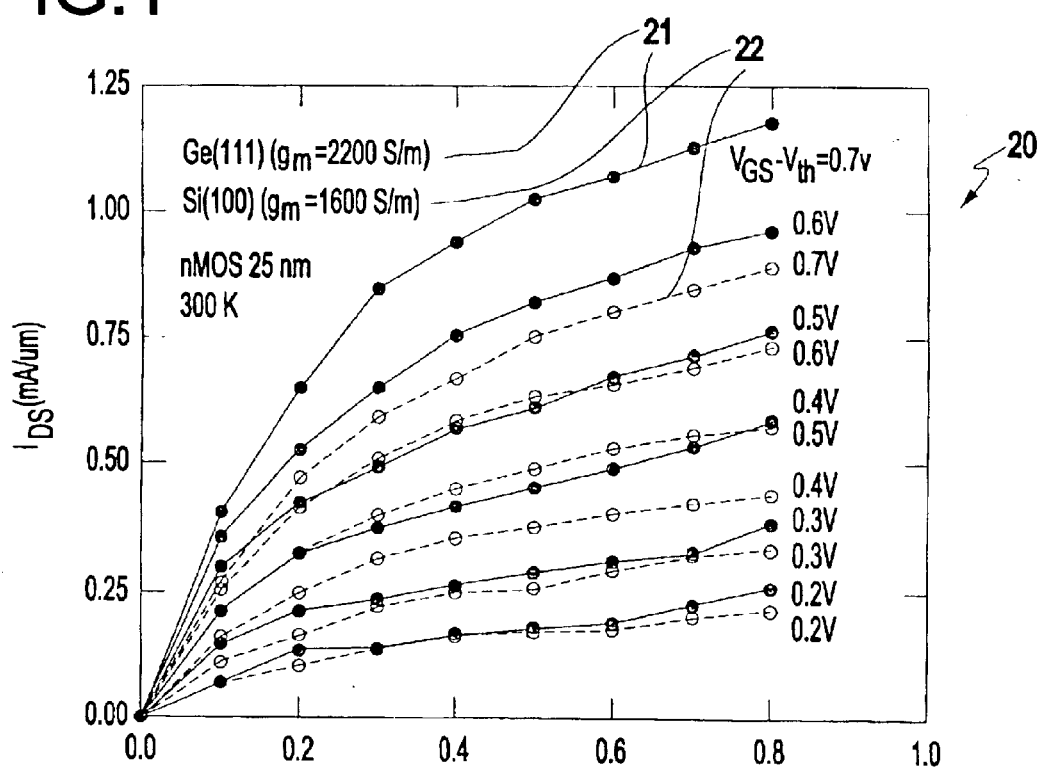
FIG. 2 shows a calculated drain-current versus drain-source voltage for a Si bulk n-MOSFET on the (100) surface and a similar Ge device on the (111) surface.

FIG. 2 shows a calculated drain-current versus drain-source voltage plot 20 for a 25 nm-channel-length Si bulk n-MOSFET on the (100) surface (plots 21) and a similar Ge device on the (111) surface (plots 22). The Ge device exhibits a significantly larger current and transconductance.

Therefore, in order to maximize the carrier transport benefits, it is necessary to choose not only the material but also the proper crystal orientation and direction along which carrier transport occurs. This invention teaches choosing a preferred crystal orientation and direction to optimize carrier transport.

Since wafers are usually cut from ingots with only one predominant crystal orientation, it is generally difficult to fabricate FETs on different crystal orientation on the same wafer. Therefore, this invention also teaches a method of fabricating both n-channel and p-channel Ge FETs on the same wafer using different FET structures with crystal planes and directions to optimize respective carrier mobility.

Figure 3:
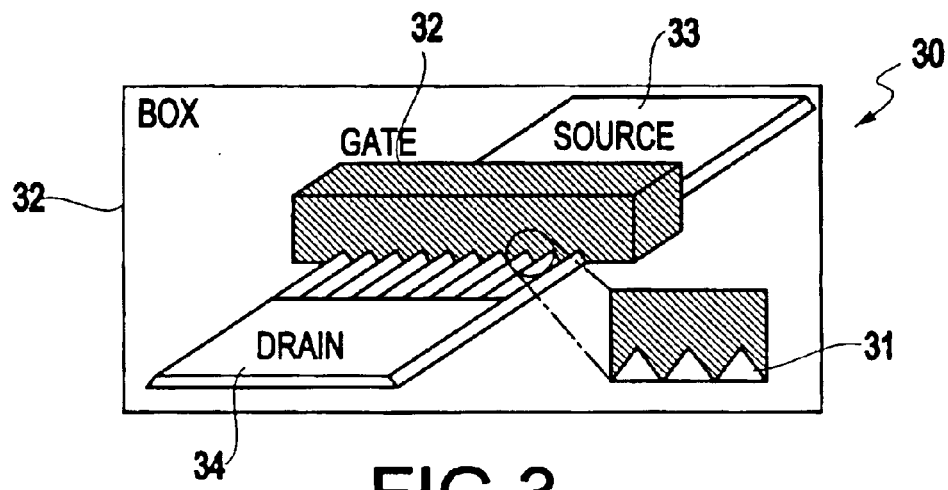
FIG. 3 shows a MOSFET structure with triangular parallel wire channel on an SOI substrate, as taught in the prior art.

FET configurations using silicon (Si) as the gate channel with a (111) structure are already known. FIG. 3 shows one example, as discussed by Saito, et. al., in "Suppression of Short Channel Effect in Triangular Parallel Wire Channel MOSFETs" (IEEE Silicon Nanoelectronics Workshop, pp. 6–7, Kyoto, Japan, Jun. 10–11, 2001) having a MOSFET structure 30 with triangular parallel wire channel 31 and fabricated on a buried oxide (BOX) 32 on silicon. The triangular parallel wire channel 31 is achieved by anisotropic etching using tetramethylammonium-hydroxide (TMAH). The resultant Si (111) plane is then covered by gate structure 32 having an oxide layer and gate electrode. The same silicon layer for the wire channel is also used for source 33 and drain 34 formation.

Figure 4:
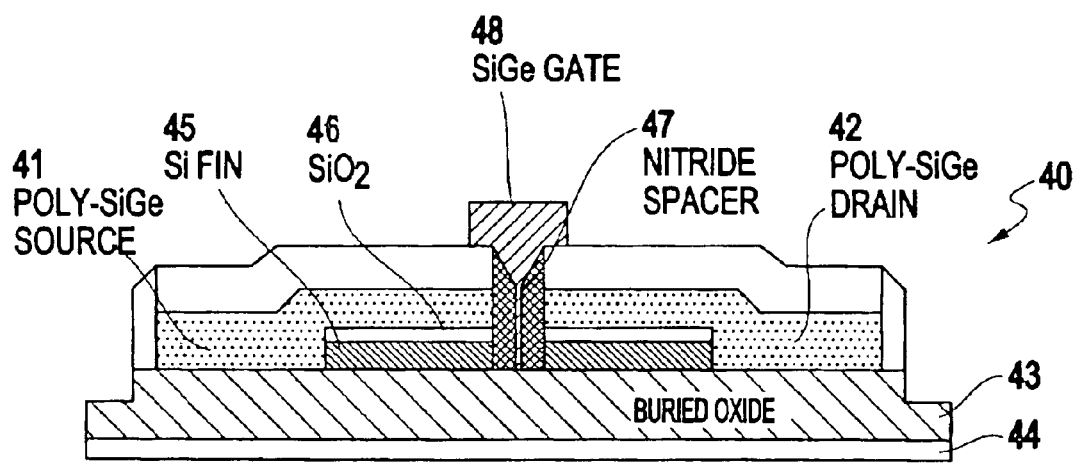
FIG. 4 shows a longitudinal cross sectional view of the FinFET structure, as taught in the prior art.

Also known in the art for suppression of the "short channel effect" is a silicon-based, self-aligned double-gate MOSFET structure referred to as FinFET. FIG. 4 shows a longitudinal cross-sectional view of the FinFET 40 described by Huang, et. al., in "Sub 50-nm FinFET: PMOS" (IEEE International Electron Devices Meeting (IEDM), pp. 67–70, 1999). The source 41 and drain 42 are fabricated using poly-SiGe on top of a buried oxide (BOX) layer 43 (on silicon wafer 44) and on top of a silicon fins 45 covered by a silicon oxide layer 46. Nitride spacers 47 and gate 48 constructed of SiGe complete the FinFET structure that allows a short channel structure as short as 17 nm and simulation promises possible scaling to 10 nm gate length.

The ultra-thin Si fin 45 serves to suppress short-channel effects. The two separations between the nitride spacers 47 define the channel length. The raised source 41 and drain 42, formed with poly-SiGe, reduce parasitic resistance.

Figure 5:
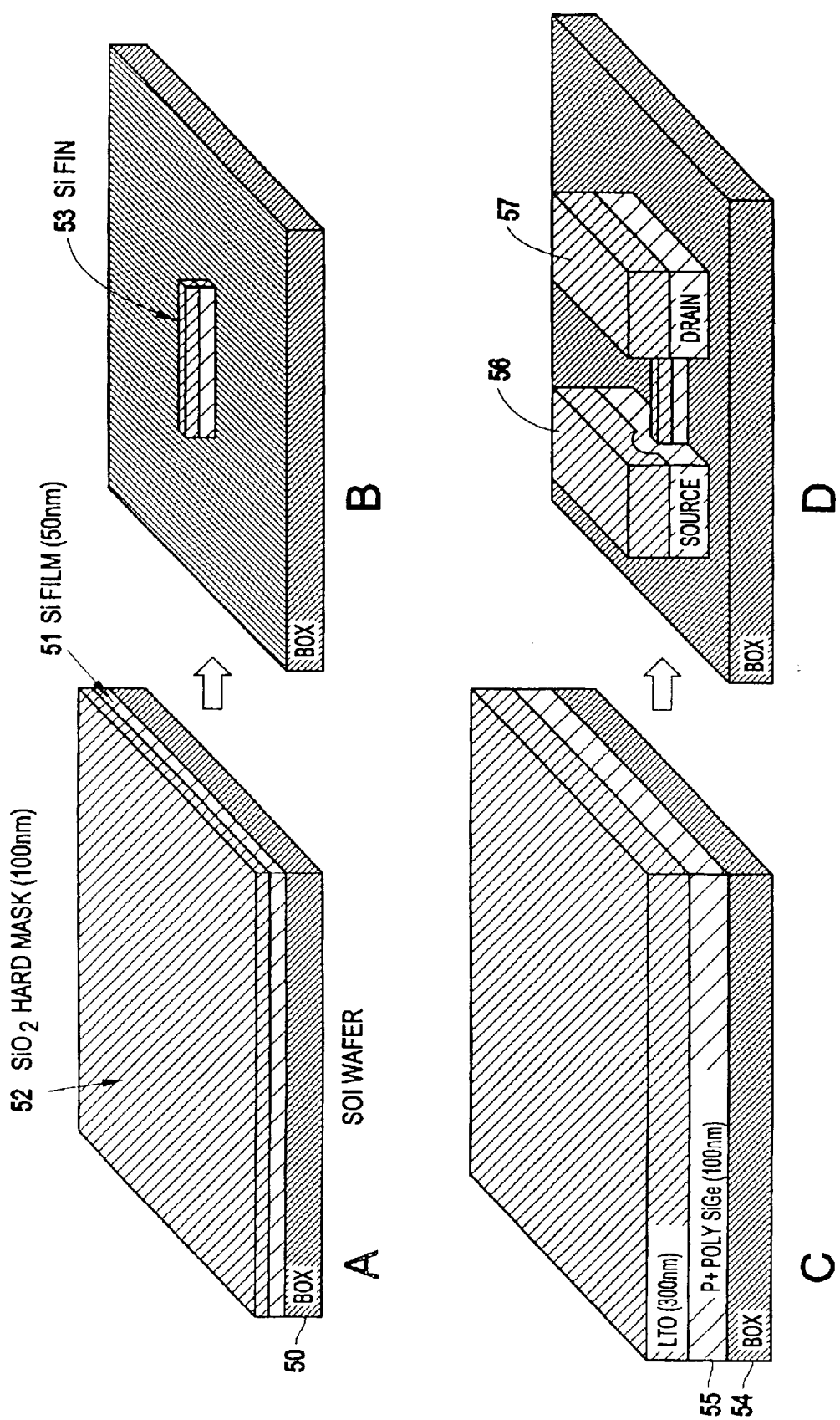
FIG. 5 shows an exemplary fabrication of the FinFET shown in FIG. 4.

FIG. 5 shows one possible fabrication sequence of this silicon-based FinFET. In step A, an Si layer 51 with thickness of 50 nm is deposited on top of BOX layer 50 of an SOI wafer, followed by a $SiO_2$ layer 52 having a thickness of 100 nm. The silicon layer 51 is etched in step B to form the oxide-covered fin structure, using E-beam lithography to etch the $SiO_2$ layer 52 to form a hard mask for etching the silicon to result in the fin structure. In step C a 300 nm thick layer of Low Temperature Oxide (LTO) is deposited on a 200 nm layer of $p^+$ poly SiGe layer, and these two layers 54 and 55 are etched in step D, first by etching the LTO layer to become a mask for reactive ion etching of the poly SiGe layer to result in the source 56 and drain 57. The nitride spacers 58 are formed in step E by deposition of a 100 nm layer of nitride and followed by etching. The gap between spacers is typically less than 20 nm.

To form the gate structure 59 of step F, a 15 nm layer of sacrificial oxide is grown and wet etched to remove the damage caused in an earlier dry-etching of the side surfaces of the fin. This step further reduces the fin thickness so that the final thickness of the fins ranges from 15 nm to 30 nm. A 2.5 nm gate oxide is grown on the side surfaces of the fin at 750° C., which "high temperature" step combined with an additional annealing step, drives boron from the SiGe raised source/drain regions into the fin underneath the nitride spacer to form $p^+$ source/drain extensions. After depositing 200 nm of in-situ-doped SiGe (60% Ge, with a workfunction of 4.75 eV) as the gate material, the electrode is patterned and etched.

By taking these prior art examples as demonstrations of techniques in which a specific crystal plane such as (111) is prepared for a specific component of a device and combining an appropriate one of such prior art techniques with the conclusions of FIGS. 1 and 2, two exemplary preferred embodiments of the present invention will be explained using germanium as the material and FET channels as specific device components.

Figure 6:
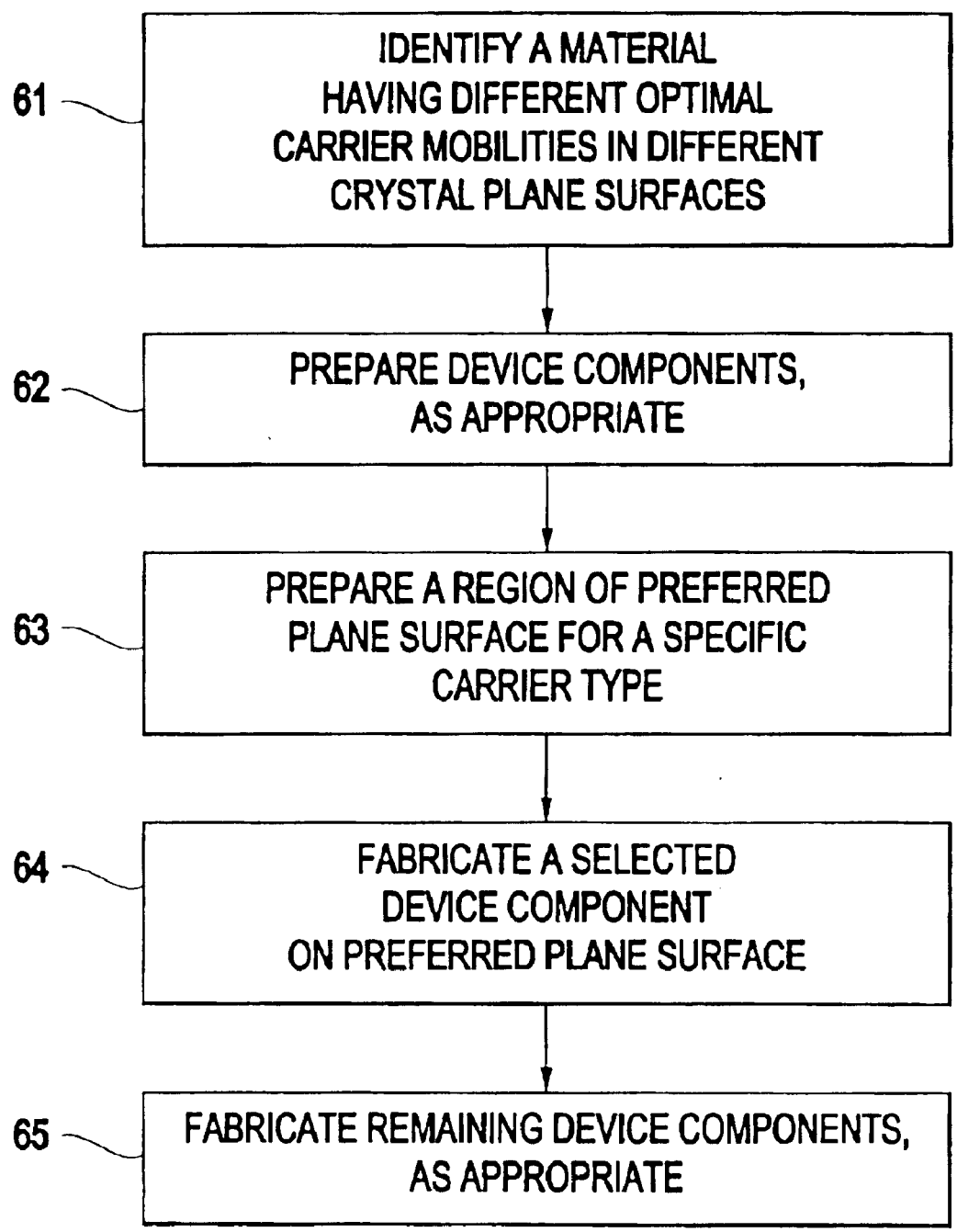
FIG. 6 shows an exemplary method for an exemplary first embodiment of the present invention.

The first exemplary embodiment comprises the method 60 summarized by FIG. 6. In step 61, a material germanium (Ge) is identified as a material having an optimal carrier mobility for an n-channel FET carrier in the (111) crystal plane and an optimal carrier mobility for a p-channel FET carrier in the (100) crystal plane. The optimal direction of carrier travel occurs in the <110> direction for both carrier types.

Accordingly, to demonstrate the first exemplary embodiment of the present invention, an n-channel FET will be designed as optimized for germinium. Since the activity of interest in a FET occurs in the channel, the component of interest for the present invention involves the nFET channel, which the present invention teaches to have an optimal carrier mobility in the (111) plane. Steps 63 and 64, therefore, teach that the channel and gate of a Ge nFET should be prepared on the (111) surface. The fabrication of remaining nFET components, such as source and drain, are straightforward but depend upon the specific nFET architecture selected. Thus, the specific device components that are prepared before step 63 and the specific device components that are prepared after step 64 depend upon the device architecture, with possible examples being the parallel wire architecture shown in FIG. 3 or the FinFET shown in FIG. 4.

Since optimal carrier travel occurs in the <110> direction, the channel orientation and the source and drain location are established accordingly, as is easily accomplished by one of ordinary skill. It is also noted that one of ordinary skill in the art will readily recognize that steps 63 and 64 may be separated in sequence so that one or more device components are fabricated in between these two steps. It should also be obvious to one of skill in the art that the germanium material could be a substrate or could be a layer added to a silicon wafer or could be a layer added to an isolation layer such as silicon oxide on top of a silicon wafer, or any other method of providing germanium as a layer or region on a wafer. The minimum thickness of a germanium layer would be that sufficient to achieve the pyramidal crystal structure of the channel for the nFET (111) plane surface.

Figure 7:
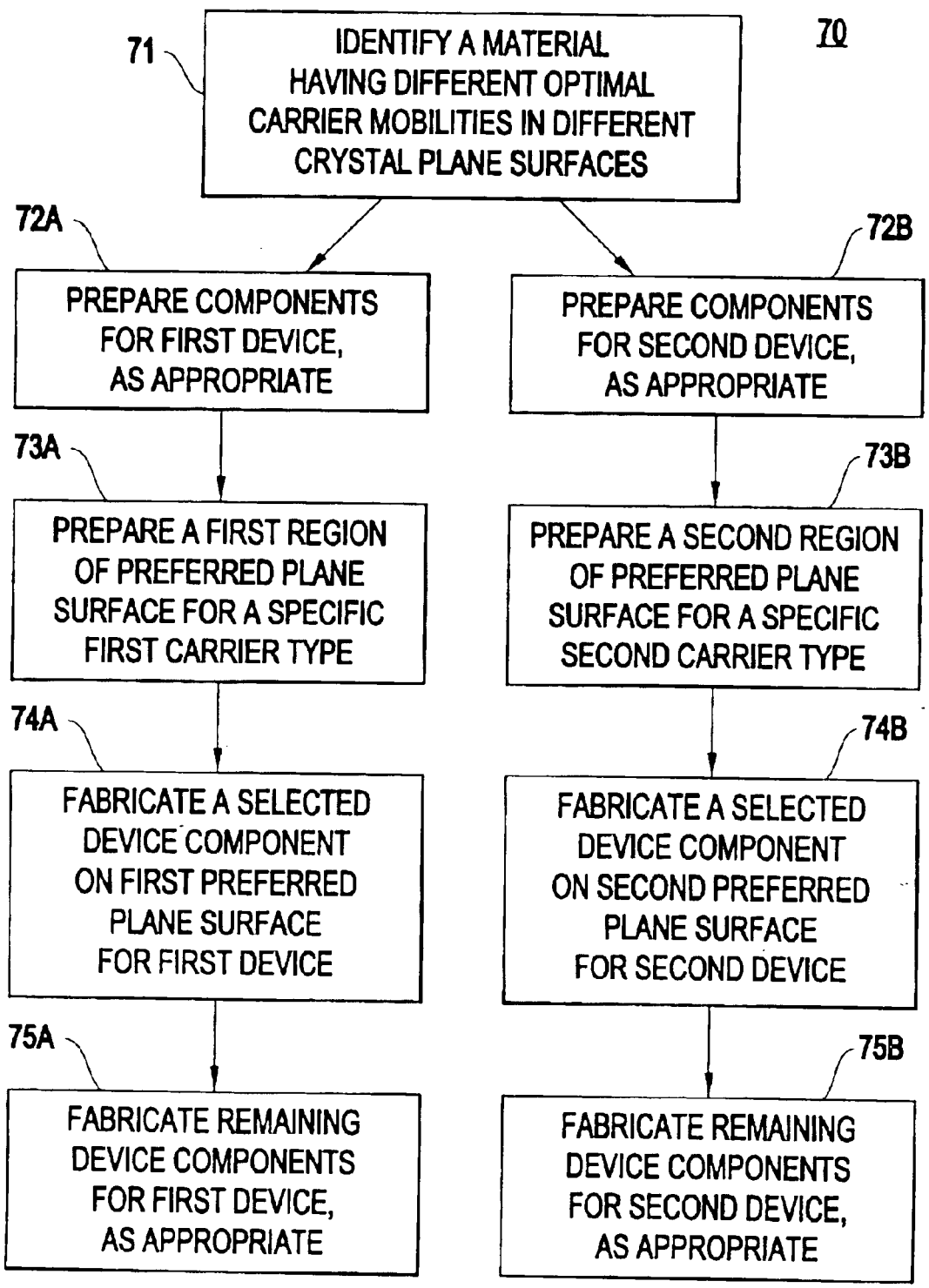
FIG. 7 shows an exemplary method for an exemplary second embodiment of the present invention.

A second exemplary embodiment of the present invention is the method 70 shown in FIG. 7. In this embodiment two different devices, each having a respective carrier type, is fabricated on the same chip so as to optimize each device as based on respective carrier characteristics. This non-limiting example comprises an nFET, as discussed in the first embodiment above, in combination with a pFET and again using germanium as the material identified in step 71. Since the nFET channel is optimal using the (111) plane and the pFET channel is optimal using the (100) plane, steps 73A, 74A, 73B and 74B comprise a preparation using a (111) etchant for a first region of germanium to become the nFET and an etchant to prepare a (100) plane in a second region of the germanium for the pFET.

It should be obvious that the preparation of the first and second regions can be done in any order and that some steps of the preparation may be shared. Additionally, similar to remarks for the above first exemplary embodiment, the nFET and pFET devices can have any of various known basic architectures. The two devices might use the same basic architecture as differing only in the channel preparation, or the two device could have different basic architectures. As noted above, the germanium could be a layer having a minimum thickness sufficient to achieve the pyramidal crystal structure of the channel for the nFET (111) plane surface. Alternatively, the germanium could be a wafer substrate, a germanium layer added to a silicon wafer, or a germanium layer added on top of an insulating layer such as silicon dioxide on a silicon wafer, or any other method of providing germanium as a layer or region on a wafer. Also as noted above, the fabrication of specific components for steps 72A, 72B, 74A, 74B, 75A, and 75B will vary depending upon the device architecture and, as above, the channel and remaining device components would be oriented to accommodate the <110> carrier preferred direction for both carriers.

Figure 8:
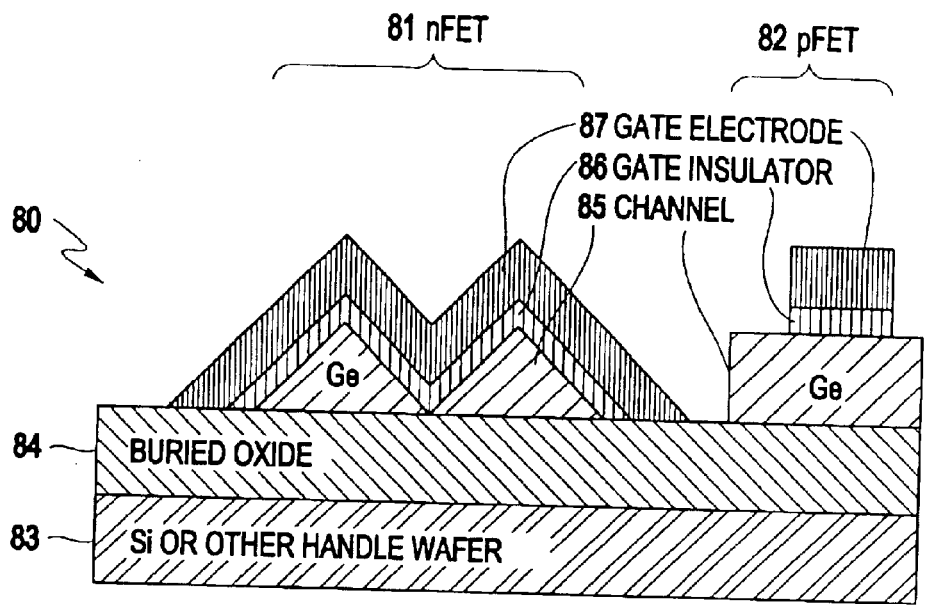
FIG. 8 shows a lateral cross section view of an exemplary nFET and pFET fabricated according to the present invention.

FIG. 8 shows an exemplary cross sectional view 80 of an nFET 81 channel and pFET 82 channel as mounted on a same chip 83 and fabricated on a common buried oxide layer (BOX) 84. Sources and drains are not shown, but the device layouts shown in FIGS. 3 and 4 can be used to explain that the source and drain would be located either behind this FIG. 8 cross sectional view or in front of it. The channel 85 is covered by a gate insulator 86 such as silicon dioxide and gate electrode 87. Fabrication of the gate insulator and electrode are well known in the art. It should be obvious that this figure illustrates the second exemplary embodiment described above as well as the first exemplary embodiment by considering the nFET 81 channel in isolation from the pFET 82.

Figure 9:
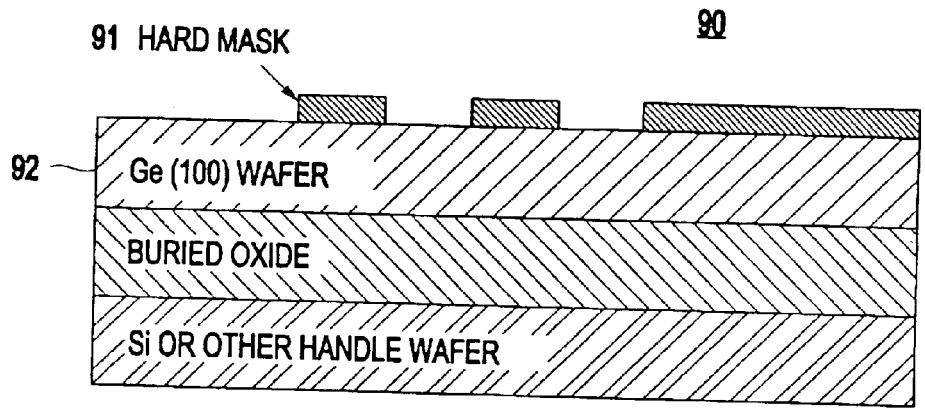
FIG. 9 shows an exemplary method to prepare a (111) plane surface for an exemplary material germanium.
Figure 9:
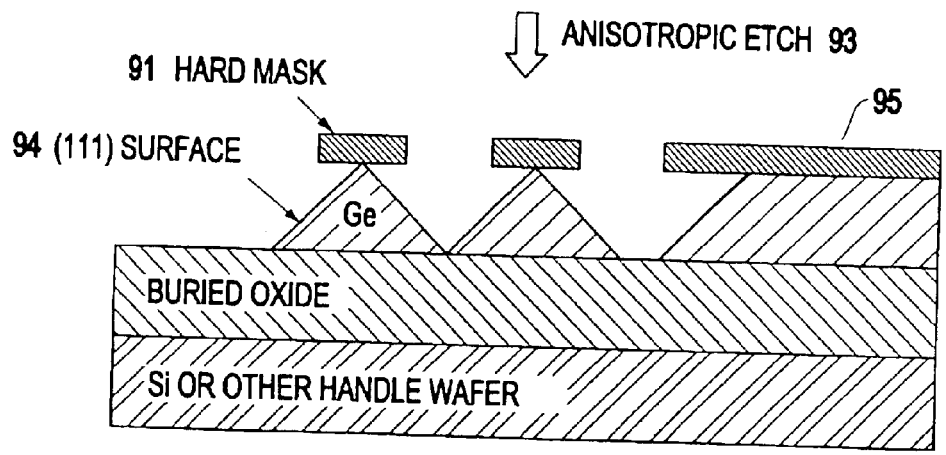

FIG. 9 shows the (111) crystal preparation 90 for the nFET region of the Ge layer 92. A hard mask 91 is located over the nFET channel region appropriate to the <110> direction. To achieve this prism structure 94 of the (111) plane, anisotropic etch 93 of germanium is done, using exemplarily an acidic chemistry (H3PO4:H2O2:C2H5OH in 1:1:1 or HF:H2O2:H2O in 17:17:66 (as taught by Lang et. al., "Bulk micromachining of Ge for IR gratings", J. Micromech. Microeng., Vol. 6, pp. 46–48, 1996). The former is preferred, using a chromium hard mask.

The region 95 shown to the right of the nFET is available to be prepared in another manner such as a Ge (100) plane surface for a pFET, using a standard vertical etchant method, as shown in the right side of FIG. 8.

Any known FET architecture could be used to complete the nFET and pFET structures, as long as the channel structure for the nFET is based on the prism structure and the channel structure for the pFET is based on the planar surface, as shown in the cross section of FIG. 8. The preferred embodiment of the invention places both channel structures so that carrier motion occurs in the <110> direction for both the nFET and pFET.

As is apparent from the above description, a primary benefit of the present invention is that the best carrier transport properties are obtained for both nFET and pFET devices in a Ge MOSFET or any MOSFET which has different transport properties on the (111) and (100) surfaces.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. An electronic chip having at least one layer of material for which a carrier mobility of a first carrier type is higher in a first crystal surface than in a second crystal surface and for which a carrier mobility of a second carrier type is higher in said second crystal surface than said first crystal surface, said electronic chip comprising:

a first device having at least one component fabricated on said first crystal surface of said material, wherein an activity of said at least one component of said first device involves primarily said first carrier type, said first crystal surface resultant from a first etching that is selective to provide said first crystal surface as a final device surface; and a second device having at least one component fabricated on said second crystal surface of said material, wherein an activity of said at least one component of said second device involves primarily said second carrier type said second crystal surface resultant from a second etching that is selective to provide said second crystal surface as a final device surface.

2. The electronic chip of claim 1, wherein said first crystal surface comprises a (111) crystal surface and said second crystal surface comprises a (100) surface.

3. The electronic chip of claim 2, wherein said material comprises germanium.

4. The electronic chip of claim 2, wherein said first device comprises an n-channel FET (Field Effect Transistor) and said second device comprises a p-channel FET and said at least one component comprises a channel of said FETs.

5. The electronic chip of claim 4, wherein said channel of at least one of said n-channel FET and said p-channel FET aligns to a <110> direction.

6. The electronic chip of claim 4, wherein at least one of said first device and said second device comprises a FinFET structure.

7. The electronic chip of claim 4, wherein said material comprises germanium.

8. An electronic chip comprising:

a first device having at least one layer of material for which a carrier mobility of a first carrier type is higher in a first crystal surface than in a second crystal surface and for which a carrier mobility of a second carrier type is higher in said second crystal surface than in said first crystal surface, said first device having at least one component fabricated with said first crystal surface of said material, said at least one component involving an activity with primarily said first carrier type, wherein said first crystal surface comprises a (111) crystal surface and said second crystal surface comprises a (100) surface and said first crystal surface and said second crystal surface are respectively resultant from a selective etch that achieves said surface as a final device surface.

9. The electronic chip of claim 8, wherein said material comprises germanium.

10. The electronic chip of claim 9, wherein said first device comprises an n-channel FET (Field Effect Transistor) and said at least one component comprises a channel of said n-channel FET.

11. The electronic chip of claim 10, wherein said channel of said n-channel FET aligns to a <110> direction.

12. The electronic chip of claim 10, wherein a structure of said n-channel FET comprises a FinFET structure.

13. The electronic chip of claim 8, further comprising:

a second device having at least one layer of said material, said second device having at least one component fabricated with said second crystal surface of said material, said at least one component of said second device involving an activity with primarily said second carrier type.

14. The electronic chip of claim 13, wherein said second device comprises a p-channel FET.

15. The electronic chip of claim 14, wherein a structure of at least one of said first device and said second device comprises a FinFET structure.

16. The electronic chip of claim 13, wherein said material comprises germanium.

17. A method of fabricating on a wafer a first device having a carrier of a first type and a second device having a carrier of a second type, said first type carrier having a higher carrier mobility in a (111) crystal surface than on a (100) crystal surface, said second type carrier having a higher carrier mobility in said (100) crystal surface than on said (111) crystal surface, said method comprising;

providing a layer of material having a characteristic that a carrier mobility of said first type carrier is higher in a (111) crystal surface than in a (100) crystal surface and a characteristic that a carrier mobility of said second type carrier is higher in said (100) crystal surface than in said (111) crystal surface;

etching a first region of said layer with a (111) etchant for at least one component of said first device to form a final surface for said first device; and etching a second region of said layer using an etchant to provide said (100) crystal surface for at least one component of said second device to form a final surface for said second device.

18. The method of claim 17, wherein said material comprises germanium.

19. The method of claim 17, wherein said first device comprises an n-channel FET (Field Effect Transistor) and said second device comprises a p-channel FET and said at least one component comprises a channel of said FETs.

20. The method of claim 17, further comprising:

aligning a carrier direction to be in a <110> direction for at least one of said at least one component of said first device and said at least one component of said second device.

\* \* \* \* \*

UNITED STATES PATENT AND TRADEMARK OFFICE
CERTIFICATE OF CORRECTION

PATENT NO. : 6,864,520 B2
DATED : March 8, 2005
INVENTOR(S) : Massimo V. Fischetti et al.

It is certified that error appears in the above-identified patent and that said Letters Patent is hereby corrected as shown below:

Column 6,
Lines 24-44, please correct claim 1 to read:
  1. An electronic chip having at least one layer of material for which a carrier mobility of a first carrier type is higher in a first crystal surface than in a second crystal surface and for which a carrier mobility of a second carrier type is higher in said second crystal surface than said first crystal surface, said electronic chip comprising:
  a first device having at least one component fabricated on said first crystal surface of said material, wherein an activity of said at least one component of said first device involves primarily said first carrier type, said first crystal surface resultant from a first etching that is selective to provide said first crystal surface as a final device surface; and a second device having at least one component fabricated on said second crystal surface of said material, wherein an activity of said least one component of said second device involves primarily said second carrier type, said second crystal surface resultant from a second etching that is selective to provide said second crystal surface as a final device surface.

Column 4,
Lines 44-46, please correct to read:
  Accordingly, to demonstrate the first exemplary embodiment of the present invention, an n-channel FET will be designed as optimized for germanium.

Signed and Sealed this

Twelfth Day of July, 2005

JON W. DUDAS
*Director of the United States Patent and Trademark Office*